United States Patent
Wang et al.

[11] Patent Number: 5,881,093
[45] Date of Patent: Mar. 9, 1999

[54] METHOD OF INTERLEAVING A CONVOLUTIONALLY CODED SIGNAL IN A SPREAD SPECTRUM COMMUNICATION SYSTEM

[75] Inventors: Michael M. Wang, Champaign; Fuyun Ling, Hoffman Estates, both of Ill.

[73] Assignee: Motorola, Inc., Schaumburg, Ill.

[21] Appl. No.: 798,577

[22] Filed: Feb. 10, 1997

[51] Int. Cl.[6] .................................................. H04B 15/00
[52] U.S. Cl. ........................... 275/200; 371/2.1; 371/2.2; 371/43
[58] Field of Search ............................... 371/37.01, 43.1, 371/43.7, 43.8, 72; 375/200, 340, 341; 370/341–343

[56] References Cited

U.S. PATENT DOCUMENTS

| | | | |
|---|---|---|---|
| 4,446,747 | 5/1984 | Berrou | 375/340 |
| 5,159,608 | 10/1992 | Falconer et al. | 375/200 |
| 5,383,217 | 1/1995 | Wheatley, III et al. | 371/43.1 |
| 5,384,810 | 1/1995 | Amrany | 371/43.1 |
| 5,453,997 | 9/1995 | Roney, IV | 371/43.1 |
| 5,537,444 | 7/1996 | Nill et al. | 375/341 |

OTHER PUBLICATIONS

IEEE Transactions on Information Theory, vol. 39, No. 6, Nov. 1993, "Coded M–DPSK with Built–In Time Diversity for Fading Channels", Lee–Fang Wei, p. 1820–1839.

*Primary Examiner*—Stephen Chin
*Assistant Examiner*—Joseph Roundtree
*Attorney, Agent, or Firm*—Richard A. Sonnentag

[57] ABSTRACT

A block interleaver (212) suitable for communication over fading channels with convolutionally coded signals as input is disclosed. The block interleaver (212) implements multiple interleaving distances which are matched to the particular convolutional code to provide better performance than conventional block interleavers.

4 Claims, 6 Drawing Sheets

| 1 ... | ... | ... N |
|---|---|---|
| 1  97 193 289 385 481 | 33 129 225 321 417 513 | 65 161 257 353 449 545 |
| 9 105 201 297 393 489 | 41 137 233 329 425 521 | 73 169 265 361 457 553 |
| 17 113 209 305 401 497 | 49 145 241 337 433 529 | 81 177 273 369 465 561 |
| 25 121 217 313 409 505 | 57 153 249 345 441 537 | 89 185 281 377 569 569 |
| 2  98 194 290 386 482 | 34 130 226 322 418 514 | 66 162 258 354 450 546 |
| 10 106 202 298 394 490 | 42 138 234 330 426 522 | 74 170 266 362 458 554 |
| 18 114 210 306 402 498 | 50 146 242 338 434 530 | 82 178 274 370 466 562 |
| 26 122 218 314 410 506 | 58 154 250 346 442 538 | 90 186 282 378 474 570 |
| 3  99 195 291 387 483 | 35 131 227 323 419 515 | 67 163 259 355 451 547 |
| 11 107 203 299 395 491 | 43 139 235 331 427 523 | 75 171 267 363 459 555 |
| 19 115 211 307 403 499 | 51 147 243 339 435 531 | 83 179 275 371 467 563 |
| 27 123 219 315 411 507 | 59 155 251 347 443 539 | 91 187 283 379 475 571 |
| 4 100 196 292 388 484 | 36 132 228 324 420 516 | 68 164 260 356 452 548 |
| 12 108 204 300 396 492 | 44 139 236 332 428 524 | 76 172 268 364 460 556 |
| 20 116 212 308 404 500 | 52 147 244 340 436 532 | 84 180 276 372 468 564 |
| 28 124 220 316 412 508 | 60 155 252 348 444 540 | 92 188 284 380 476 572 |
| 5 101 197 293 389 485 | 37 133 229 325 421 517 | 69 165 261 357 453 549 |
| 13 109 205 301 397 493 | 45 141 237 333 429 525 | 77 173 269 365 461 557 |
| 21 117 213 309 405 501 | 53 149 245 341 437 533 | 85 181 277 373 469 565 |
| 29 125 221 317 413 509 | 61 157 253 349 445 541 | 93 189 285 381 477 573 |
| 6 102 198 294 390 486 | 38 134 230 326 422 518 | 70 166 262 358 545 550 |
| 14 110 206 302 398 494 | 46 142 238 334 430 526 | 78 174 270 366 462 558 |
| 22 118 214 310 406 502 | 54 150 246 342 438 534 | 86 182 278 374 470 566 |
| 30 126 222 318 414 510 | 62 158 254 350 446 542 | 94 190 285 382 478 574 |
| 7 103 199 295 391 487 | 39 135 231 327 423 519 | 71 167 263 359 546 551 |
| 15 111 207 303 399 495 | 47 143 239 335 431 527 | 79 175 271 367 463 559 |
| 23 119 215 311 407 503 | 55 151 247 343 439 535 | 87 183 279 375 471 567 |
| 31 127 223 319 415 511 | 63 159 255 351 447 543 | 95 191 286 383 479 575 |
| 8 104 200 296 392 488 | 40 136 232 328 424 520 | 72 168 264 360 547 552 |
| 16 112 208 304 400 496 | 48 144 240 336 432 528 | 80 176 272 368 464 560 |
| 24 120 216 312 408 504 | 56 152 248 344 440 536 | 88 184 280 376 472 568 |
| M 32 128 224 320 416 512 | 64 160 256 352 448 544 | 96 192 287 384 480 576 |

| I • • • | • • • | • • • N |

METHOD OF INTERLEAVING A CONVOLUTIONALLY CODED SIGNAL IN A SPREAD SPECTRUM COMMUNICATION SYSTEM

FIELD OF THE INVENTION

The present invention relates generally to interleaving information and, more particularly, to interleaving convolutionally coded information in a spread spectrum communication system.

BACKGROUND OF THE INVENTION

Block interleavers are widely used in communication systems employing block coding. Such interleavers are also used for block-terminated convolutionally coded communication signals such as those implemented in the spread spectrum communication standard TIA/EIA/IS-95A, *Mobile Station-Base Station Compatibility Standard for Dual Mode Wideband Spread Spectrum Cellular System*, July 1993 available from the Telecommunication Industry Association (TIA). It is well known that for block coding, the interleaver should be designed such that the minimum time span between any two bits in a code word should be maximized. For example, assuming that the size of the block code is M and the size of the block interleaver is L=kM, the minimum distance between any two bits in a code word cannot be larger than k. Thus, the optimal block interleaver for such a code has the form of a matrix with k rows and M columns. Within a transmitter which implements the interleaver, the matrix is filled in column-by-column and read out row-by-row and the minimum distance between any two bits in a code word is clearly k, which is optimal.

When the block interleaver is used for interleaving a convolutionally coded signal, however, the optimal design of the interleaver is unclear. In a rate 1/r convolutional code, the lengths of code words start from the constraint length Kr of the code to infinity. Since errors are most likely to occur for the few shortest code word lengths, it is often to select the number of rows to be equal to or slightly greater than Kr where r is the coding rate. However, such a design criterion is by no means optimal for an interleaver to be used in conjunction with the convolutional code.

Thus, a need exists for an interleaver which attains optimal performance for an associated convolutional code.

BRIEF DESCRIPTION OF THE DRAWINGS

FIG. 3 generally depicts a prior art interleaver matrix.

FIG. 4 generally depicts an interleaver matrix produced by an interleaver implementing interleaving of convolutionally coded signals in accordance with the invention.

FIG. 6 generally depicts an alternate interleaver matrix produced by an interleaver implementing interleaving of convolutionally coded signals in accordance with the invention.

DETAILED DESCRIPTION OF A PREFERRED EMBODIMENT

A block interleaver suitable for communication over fading channels with convolutionally coded signals as input is disclosed. The block interleaver implements multiple interleaving distances which are matched to the particular convolutional code to provide better performance than conventional block interleavers.

Generally stated, a method of interleaving an input convolutionally coded signal is implemented in a spread spectrum communication system which itself implements a coder providing codes having a predetermined constraint length, a predetermined number of consecutive trellis transition branches, and a decoding depth. The interleaving is performed by determining a first maximum of the possible minimum-separation of a number of coded bits in the predetermined number of consecutive trellis transition branches and next determining a second maximum of the possible minimum-separation of a number of coded bits in the number of consecutive branches associated with the constraint length of the code. Finally, a third maximum of the possible minimum-separation of a number of coded bits in the number of branches associated with the decoding depth is determined and the input convolutionally coded signal is then interleaved based on the first, second and third maximums so determined.

In the preferred embodiment, the predetermined number of consecutive trellis transition branches is less than the constraint length of the code, and more specifically, the predetermined number of consecutive trellis transition branches approximately equals the square root of the constraint length of the code. Also in the preferred embodiment, the spread spectrum communication system is compatible with IS-95A.

Stated differently, an input convolutionally coded signal comprised of a predetermined number of bits L are interleaved into a matrix having N columns and M rows. The method in accordance with the invention performs the steps of, for each column, dividing each column into M/M1 blocks, filling the first elements of the M/M1 blocks from the top to the bottom with the input code bits and filling the second elements of the M/M1 blocks from the top to the bottom, and proceeding until the last elements of the M/M1 blocks are filled. The above steps are repeated for the next column.

The steps performed to fill the N columns includes dividing the N columns into N/N1 blocks, filling the first columns of the N/N1 blocks, column by column, from the left to the right as described above and filling the second column of the N/N1 blocks, and proceeding until all of the columns are filled. The spread spectrum communication system implementing this method in accordance with the invention is also compatible with IS-95A.

Figure 1:
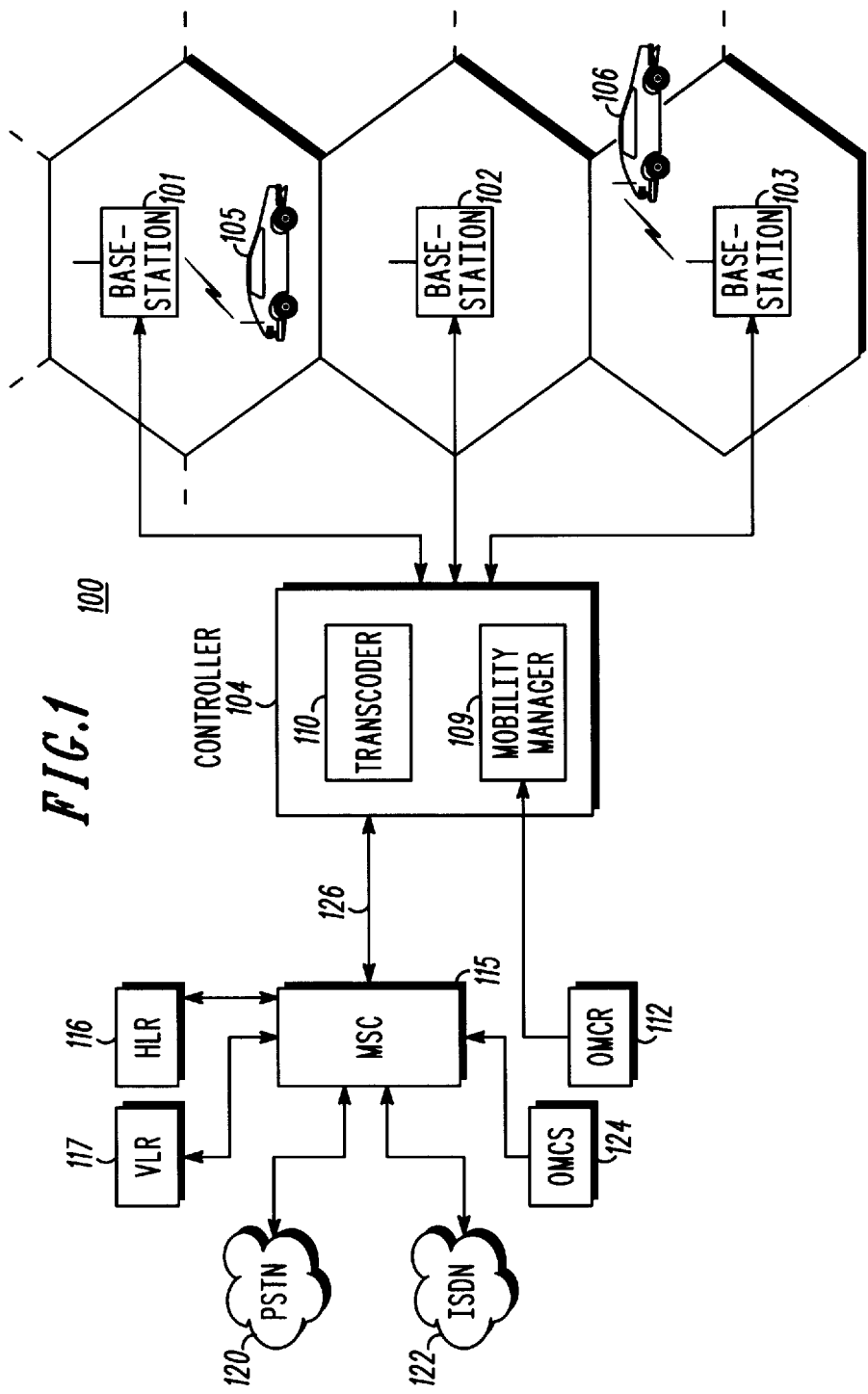
FIG. 1 generally depicts a block diagram of a communication system which may beneficially implement interleaving of convolutionally coded signals in accordance with the invention.

FIG. 1 generally depicts a block diagram of a communication system 100 which may beneficially implement signal production in a spread spectrum communication system in accordance with the invention. In the preferred embodiment, the communication system is a direct sequence code-division multiple access (DSCDMA) cellular radiotelephone system.

As seen in FIG. 1, multiple base-stations 101–103 are coupled to a controller 104. Each base-station 101–103 provides radio frequency (RF) communication to mobile stations 105–106. In the preferred embodiment, the transmitter/receiver (transceiver) hardware implemented in the base-stations 101–103 and the mobile stations 105–106 to support the RF communication is defined in the document titled TIA/EIA/IS-95A, *Mobile Station-Base Station Compatibility Standard for Dual Mode Wideband Spread Spectrum Cellular System*, July 1993 available from the Telecommunication Industry Association (TIA). Continuing, the controller 104 is responsible for, inter alia, call processing via the transcoder 110 and mobility management via the mobility manager 109. Other tasks of the controller 104 include feature control and transmission and networking interfacing. For more information on the functionality of the controller 104, reference is made to U.S. Pat. No. 5,475,686 to Bach et al., assigned to the assignee of the present application, and incorporated herein by reference.

Also depicted in FIG. 1 is an operations and maintenance center - radio (OMCR) 112 coupled to the mobility manager 109 of the controller 104. The OMCR 112 is responsible for the operations and general maintenance of the radio portion (controller 104 and base-stations 101–103 combined) of the communication system 100. The controller 104 is coupled to a mobile switching center (MSC) 115 which provides switching capability between the public switched telephone network (PSTN) 120, the integrated services digital network (ISDN) 122 and the controller 104. The operations and maintenance center - switch (OMCS) 124 is responsible for the operations and general maintenance of the switching portion (MSC 115) of the communication system 100. The home location register (HLR) 116 and the visitor location register (VLR) 117 provide the communication system 100 with user information primarily used for billing purposes.

The functionality of the controller 104, MSC 115, HLR 116 and VLR 117 is shown in FIG. 1 as distributed, however one of ordinary skill in the art will appreciate that the functionality could likewise be centralized into a single element. Also, for different configurations, the transcoder 110 could likewise be located at either the MSC 115 or the base-stations 101–103. In the preferred embodiment, the link 126 coupling the MSC 115 with the controller 104 is a T1/E1 link which is well known in the art. By placing the transcoder 110 at the controller 104, a 4:1 improvement in link budget is realized due to compression of the input signal (input from the T1 /E1 link 126) by the transcoder 110. The compressed signal is transferred to a particular base-station 101–103 for transmission to a particular mobile station 105–106. Important to note is that the compressed signal transferred to a particular base-station 101–103 undergoes further processing at the base-station 101–103 before transmission occurs. Put differently, the eventual signal transmitted to the mobile station 105–106 is different in form but the same in substance as the compressed signal exiting the transcoder 110.

When the mobile station 105–106 receives the signal transmitted by a base-station 101–103, the mobile station 105–106 will essentially "undo" (commonly referred to as "decode") all of the processing done at the base-station 101–103 and the speech coding done by the transcoder 110. When the mobile station 105–106 transmits a signal back to a base-station 101–103, the mobile station 105–106 likewise implements speech coding. Thus, the speech coder 110 of FIG. 1 resides at the mobile station 105–106 as well. After a signal having undergone speech coding is transmitted by the mobile station 105–106 (the mobile station also performs further processing of the signal to change the form, but not the substance, of the signal) to a base-station 101–103, the base-station 101–103 will "undo" the processing performed on the signal and transfer the resulting signal to the transcoder 110 for speech decoding. After speech decoding by the transcoder 110, the signal is transferred to an end user via the T1/E1 link 126. While the switching capability of the MSC 106 and the control capability of the controller 104 are shown as distributed in FIG. 1, one of ordinary skill in the art will appreciate that the two functions could be combined in a common physical entity for system implementation.

The reverse-link (mobile station to base-station) channel in the CDMA cellular radiotelephone communication system of FIG. 1 is composed of an access channel and a plurality of traffic channels, each of which is used by one user. These channels share the same CDMA frequency assignment using direct-sequence CDMA techniques. Each traffic channel is identified by a distinct long code sequence associated with a particular user; each access channel is identified by a distinct access channel long code sequence. Multiple reverse-link CDMA channels may be used by a base-station in a frequency division multiplexed manner.

Figure 2:
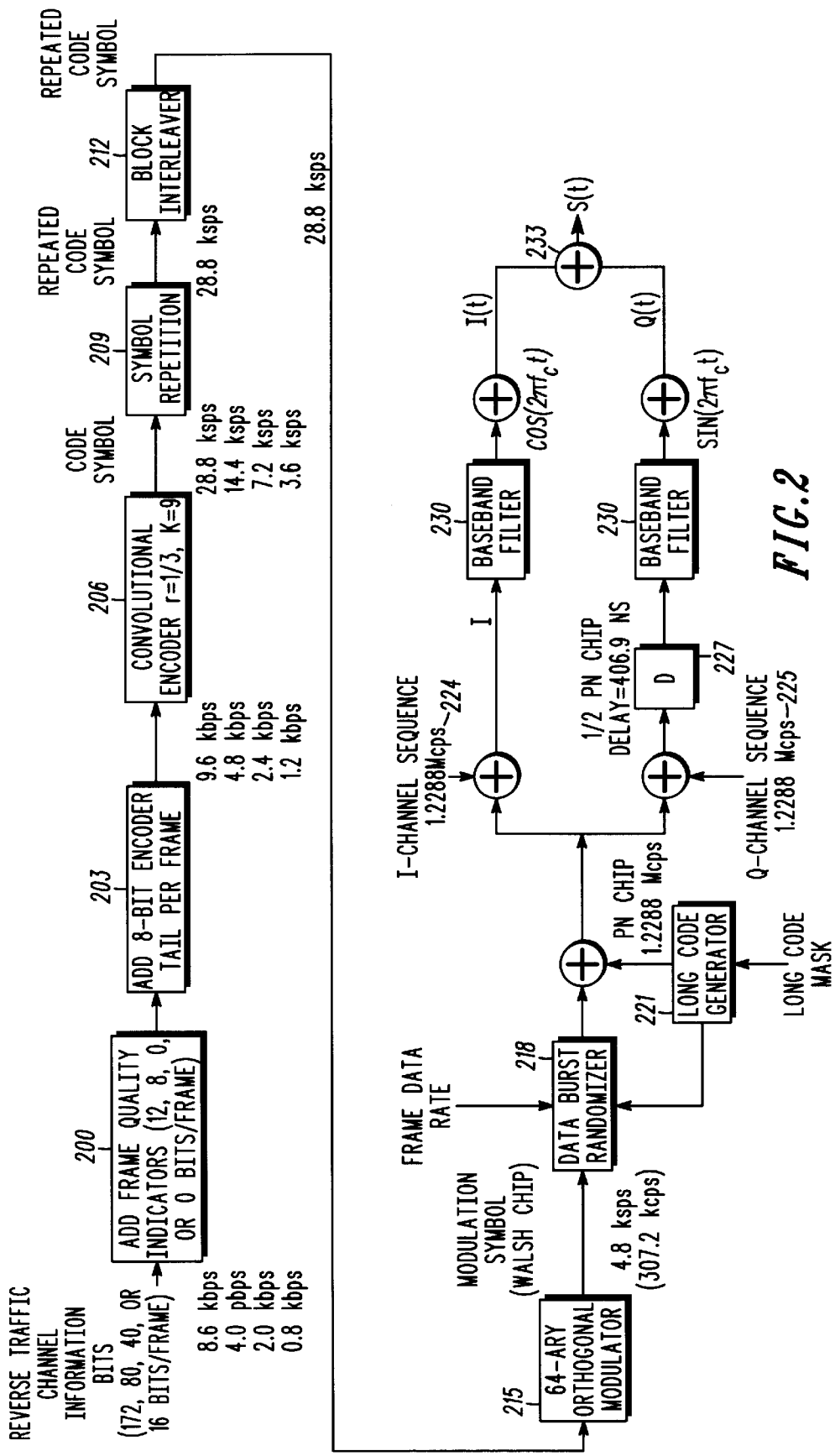
FIG. 2 generally depicts a block diagram of a mobile station transmitter capable of implementing interleaving of convolutionally coded signals in accordance with the invention.

FIG. 2 generally depicts a block diagram of a transmitter in a mobile station 105 capable of implementing interleaving of convolutionally coded signals in accordance with the invention. The block diagram depicted in FIG. 2 is identical to that shown in the above-mentioned IS-95A standard, and is well known in the art. For a detailed description of the block diagram depicted in FIG. 2, reference is made to the above-cited IS-95A document.

Generally, reverse traffic channel information bits are input to block 200 where frame quality indicators are added. The output of block 200 is then input into block 203 where an 8-bit encoder tail is added per frame of information. The output of block 203 is then convolutionally encoded by the encoding block 206. Symbol repetition of the encoded output of the encoding block 206 is then performed by the symbol repetition block 209. At this point, the output of the symbol repetition block 209 is input into the block interleaver 212. The block interleaver 212 performs block interleaving as described in § 6.1.3.1.5 of IS-95A, and outputs the prior art interleaver matrix depicted in FIG. 3. The functionality of the remaining blocks of FIG. 2 is described in detail in above-cited IS-95A document.

At this point, it is useful to define a nomenclature to aid in describing interleaving matrices. As such:

S(J)=possible minimum-separation of the rJ coded bits in J consecutive trellis transition branches;

S(K)=possible minimum-separation of the rK coded bits in any consecutive K branches;

S(K')=possible minimum-separation of the rK' coded bits in K' branches, where K' is the longest unmerged path with a weight equal to the minimum distance;

S(D)=possible minimum-separation.

Figure 3:
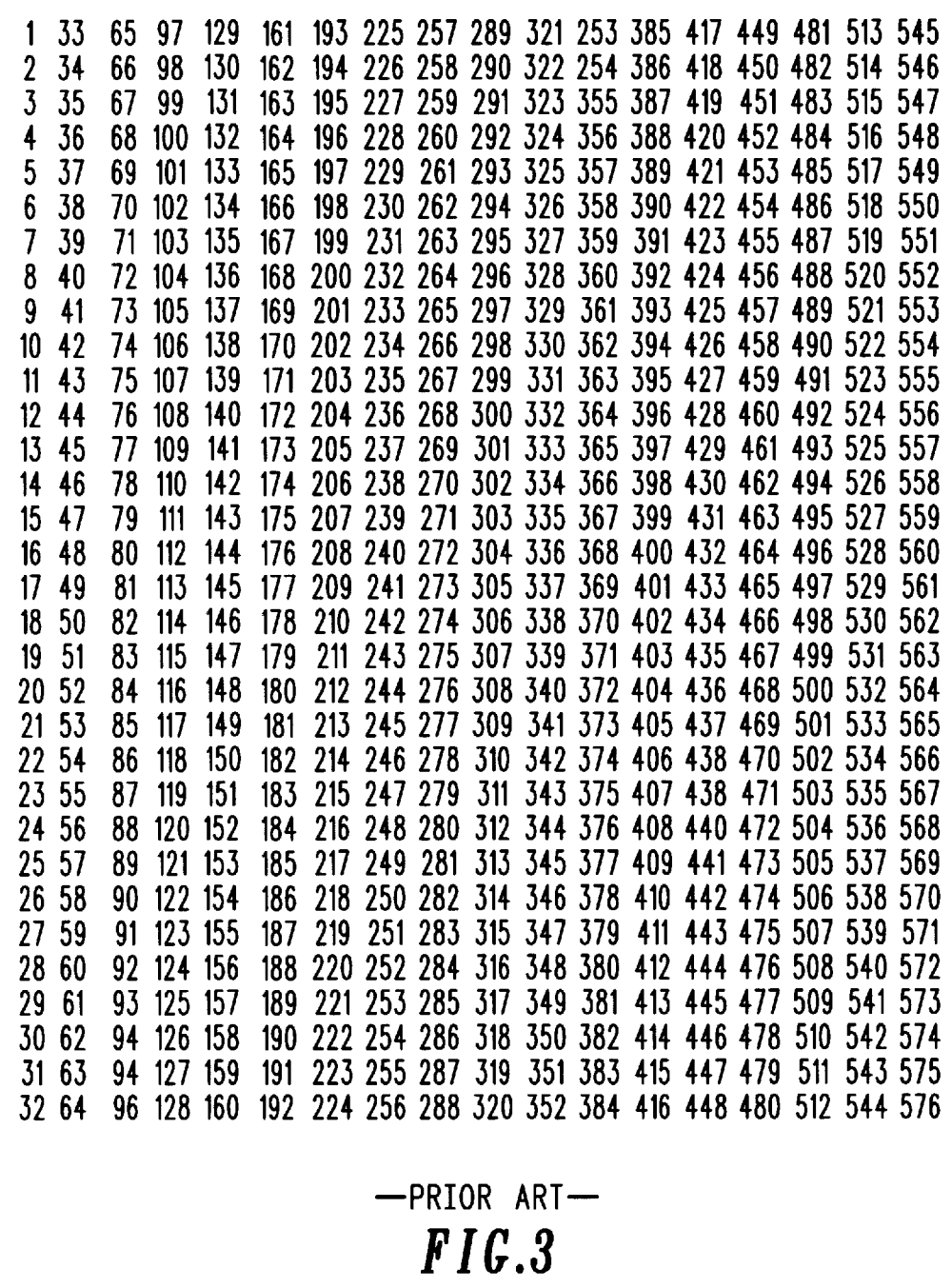

For the interleaver matrix depicted in FIG. 3, we have S(J)=3, S(K')=3, and S(D)=0 most of the time.

Unlike a block code, for which any bit within a codeword has the same impact to the performance of the code, a convolutional code, codewords overlap with one another. For simplicity, we only consider the shortest codeword, which has a length of Kr bits, of a convolutional code with constraint length K and coding rate r. The r bits in the same trellis branch will be shared by K codeword with length Kr. The consecutive 2r bits will be shared by K-1 codeword and etc. Thus, even though the r bits in a branch and r bits distributed in more than one branches will have the same impact to the decision of a codeword which contains all these branches, the r bits distributed in a few different branches affect fewer codeword decisions than the r bits in one branch. As a result, we cannot view the r bits in the same branch as having equal importance as the r bits distributed over a few different branches to the code performance.

The deficiencies in the interleaver matrix depicted in FIG. 3 with reference to the above discussion are now described. By using the interleaver matrix shown in FIG. 3, the coded bits constitute J, e.g., J=3, consecutive trellis transition branches are relatively close to one another. Specifically, they are concentrated over less than one third of the block instead of being evenly distributed over the entire block. Moreover, the coded bits belonging to the branch N and N+11 typically belong to the same Walsh symbols and, thus, are very highly correlated. Since these two branches belong to a code word that is not much longer than the shortest code word, such a high correlation increases the probability of errors.

In accordance with the invention, an interleaver which implements r contiguous coded bits will have a larger impact to code performance than the coded bits distributed over a long time interval. To optimally match the interleaver with the convolutional code, the interleaver should:

(1) determine the maximum of the possible minimum-separation, S(J), of the rJ coded bits in J consecutive trellis transition branches, where J is less than the constraint length K of the code and optimally to be chosen to be close to the square root of K. Note that S(J)<=L/rJ.

(2) determine the maximum of the possible minimum-separation, S(K), of the rK coded bits in any consecutive K branches, where K is the constraint length of the code, or, (2') determine the maximum of the possible minimum-separation, S(K'), of the rK' coded bits in K' branches, where K' is the longest unmerged path with a weight equal to the minimum distance. Note that S(K')<=L/rK' and S(K)<=L/rK.

(3) determine the maximum of the possible minimum-separation, S(D), of the rD coded bits in D branches where D is the necessary decoding depth which achieves close to optimal decoding performance. Note that S(D)<=L/rD.

It is noted that, because D>K'>K>J, the possible maximum of the minimum-separations S(D)<S(K')<S(K)<S(J). The interleaver thus achieves the best possible separations for the most important coded bits while not reducing the separation of the less important ones.

For an orthogonally modulated convolutional coded signal, the separation has a unit of a Walsh symbol because all the bits within one Walsh symbol can be viewed as highly correlated. For the convolutional code (K=9, r=⅓) used in IS-95A, rK=3*9=27. We can assume that K' is slightly larger than K and let rK'=32. Using the rule J equal to square root of K, i.e., J=3 and rJ=9. The required decision delay is conventionally assumed to be less than or equal to D=5K= 45. We assume that D=32 here because it is known for a low rate code, the required delay is less than 5K. Thus, we obtain an optimal interleaver matrix 400 for such signaling as shown in FIG. 4. For such an interleaver matrix 400, we have most of S(J)>=9 Walsh symbols (with a few S(j)=6), where to simplify design we have chosen rJ=8 instead of 9, most of S(K')=3 Walsh symbols (with a few S(K')=2) and S(D)=1 Walsh symbol.

Such an interleaver matrix 400 as shown in FIG. 4 in accordance with the invention can be described in a general form using parameters M, N, M1, and N1. The interleaver matrix 400 of FIG. 4 consists of an array with M rows and N columns. The numbers M or M+1 must be divisible by M1 and the numbers N or N+1 must be divisible by N1. Code symbols are written into the array by column-filling the complete L=N×M interleaver matrix as described below. The data within the interleaver matrix 400 is then read out row-by-row sequentially.

The rows of the interleaver matrix 400 are numbered from top to bottom as 1–M and the columns of the interleaver matrix 400 are numbered from left to right from 1 to N. The process of filling the array of the second order interleaver is best described by the pseudo-code shown below:

```
Initialization: n0 = 1, i = 1.
while (n0 <= N1) {
    n = n0;
    while (n <= N) {
        m0 = 1;
        while (m0 <= M1) {
            m = m0;
            while (m <= M) {
                Array(m,n) = code symbol i;
                m += M1;
                i ++;
            }
            m0++;
        }
        n += N1;
    }
    n0++;
}
```

For the interleaver matrix 400 depicted in FIG. 4, the number of rows M is equal to 32 and M1 is equal to 4. The number of columns N is equal to the total number of code bits L divided by M. In the preferred embodiment shown in FIG. 4, L=576, thus N=18 and N1=N/3=6.

The interleaving matrix 400 is filled starting from the top left corner. The first input bit (1) is at the top left, the second input bit (2) is M1 (four) rows below the first input bit, and the third input bit (3) is M1 (four) rows below the second input bit, and so on, until the eighth input bit (8) is filled into the 29th row. The ninth input bit (9) is then filled into the second row and so on. Finally the thirty-second input bit (32) is filled at the first column and the 32nd row. After the first column is filled, the thirty-third input bit (33) is filled into the first row of the 7th column. Once this column is completely filled (as was done for the first column), the sixty-fifth input bit (65) is filled into the first row of the 13th column. The process continues until all the code bits are filled into the interleaver matrix 400.

Figure 5:
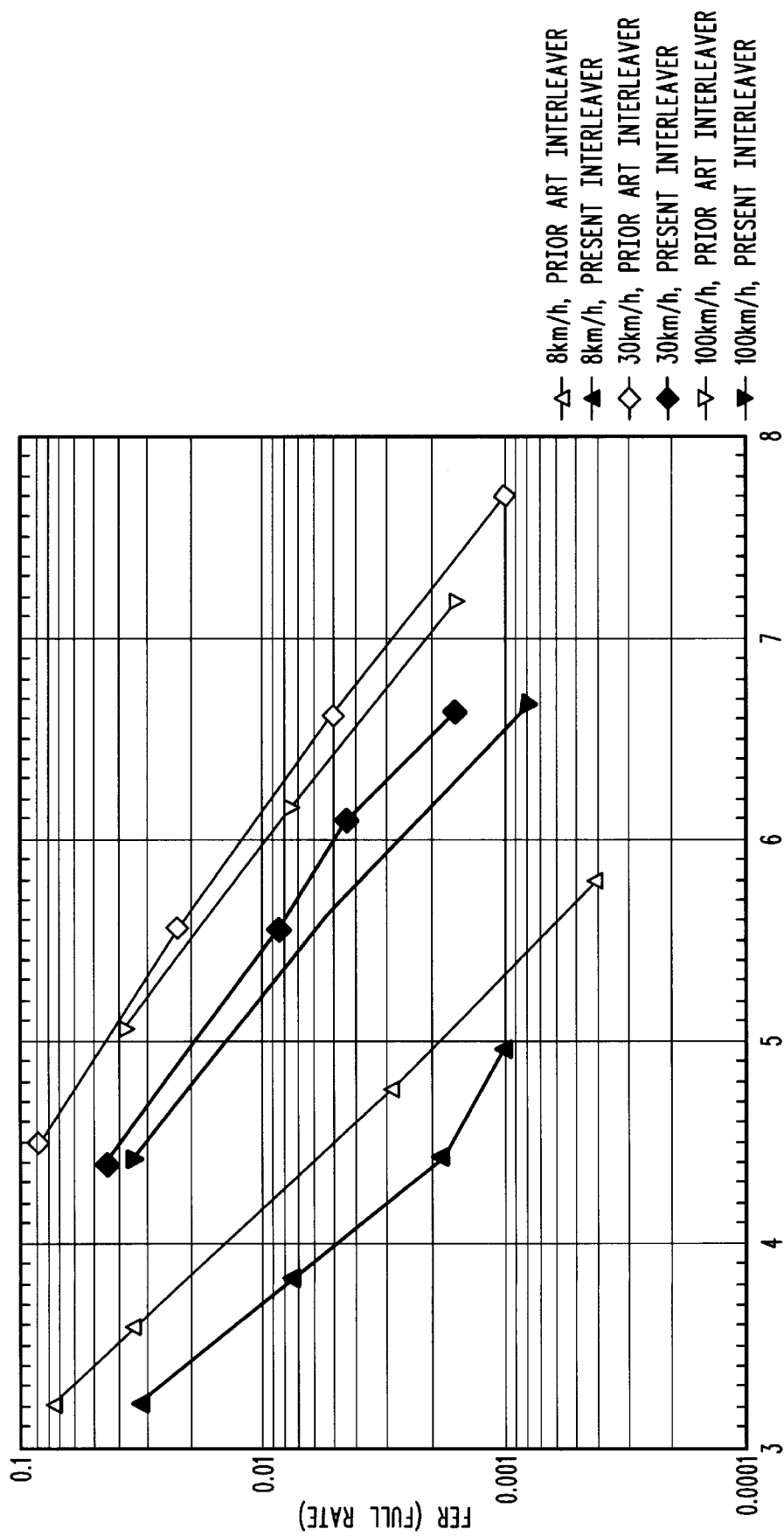
FIG. 5 generally depicts mobile station performance comparison between an interleaver implementing the prior art interleaver matrix and an interleaver implementing interleaving of convolutionally coded signals in accordance with the invention.

FIG. 5 generally depicts a performance comparison between an interleaver implementing the prior art interleaver matrix and an interleaver implementing interleaving of convolutionally coded signals in accordance with the invention. As is shown in FIG. 5, performance expressed as frame erasure rate (FER) is improved by 0.5 dB when using the present interleaver in accordance with the invention. The performance improvement is due to the better characteristics of the interleaving matrix shown in FIG. 4 than that of the interleaving matrix shown in FIG. 3. Specifically, using the matrix shown in FIG. 4, any 8 adjacent coded bits are evenly distributed over the entire interleaving matrix to achieve maximum possible separation. Since these bits belong to three consecutive trellis branches, which have more chance to cause errors than farther separated bits, wider separation of these bits greatly reduces their correlation and, thus, reduces the probability of error. Additionally, the bits belong to N and N+11 branches belong to different Walsh symbols, thus their correlation is reduced compared to the prior art interleaving matrix shown in FIG. 3.

Figure 6:
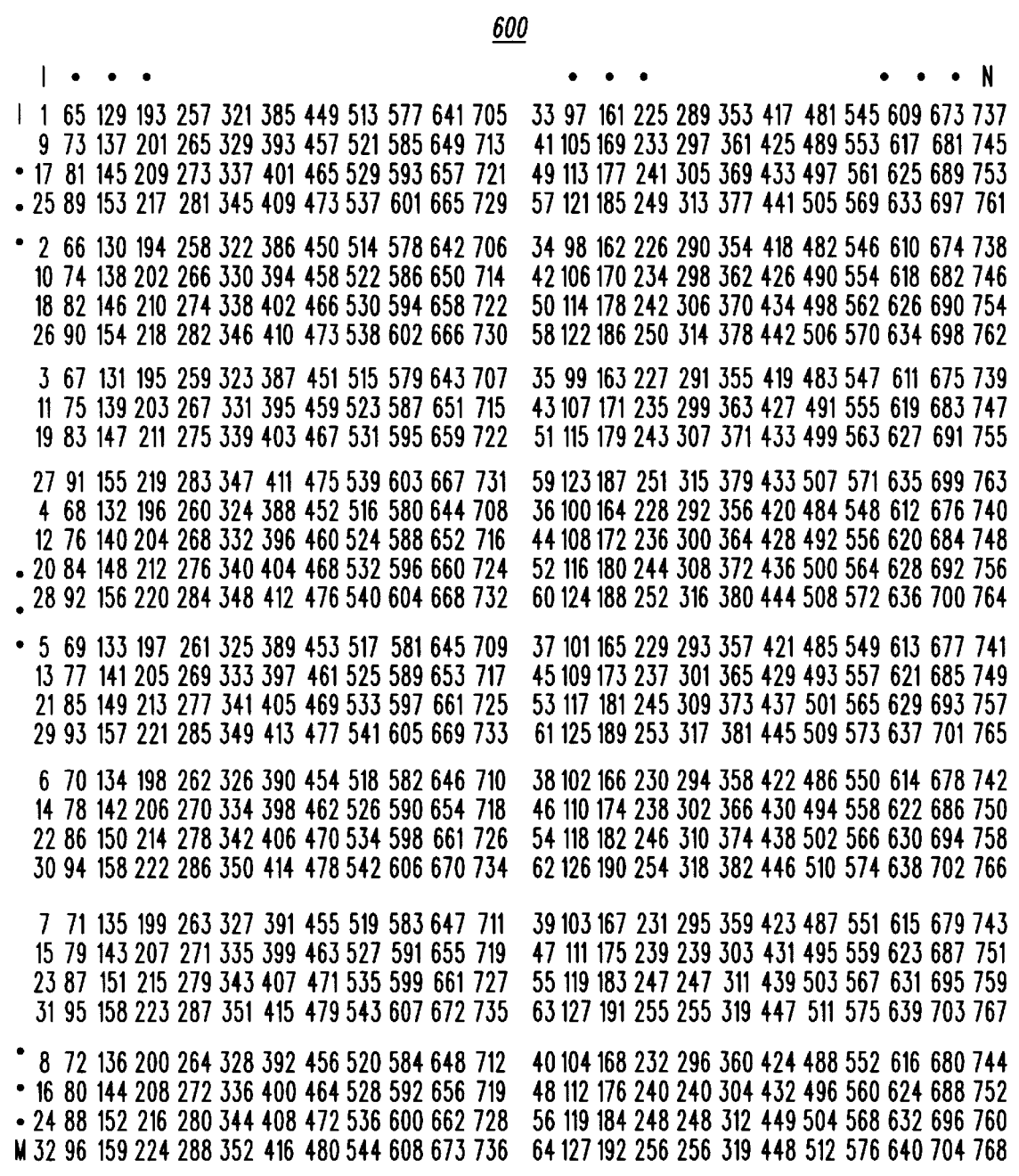

FIG. 6 generally depicts an alternate interleaver matrix 600 produced by an interleaver implementing interleaving of convolutionally coded signals in accordance with the invention.

For the interleaver matrix 600 depicted in FIG. 6, the number of this column is completely filled (as was done for the first column), the sixty-fifth input bit (65) is filled into the first row of the 13th column. The process continues until all the code bits are filled into the interleaver matrix 400.

FIG. 5 generally depicts a performance comparison between an interleaver implementing the prior art interleaver matrix and an interleaver implementing interleaving of convolutionally coded signals in accordance with the invention. As is shown in FIG. 5, performance expressed as frame erasure rate (FER) is improved by 0.5 dB when using the present interleaver in accordance with the invention. The performance improvement is due to the better characteristics of the interleaving matrix shown in FIG. 4 than that of the interleaving matrix shown in FIG. 3. Specifically, using the matrix shown in FIG. 4, any 8 adjacent coded bits are evenly distributed over the entire interleaving matrix to achieve maximum possible separation. Since these bits belong to three consecutive trellis branches, which have more chance to cause errors than farther separated bits, wider separation of these bits greatly reduces their correlation and, thus, reduces the probability of error. Additionally, the bits belong to N and N+11 branches belong to different Walsh symbols, thus their correlation is reduced compared to the prior art interleaving matrix shown in FIG. 3.

FIG. 6 generally depicts an alternate interleaver matrix 600 produced by an interleaver implementing interleaving of convolutionally coded signals in accordance with the invention. For the interleaver matrix 600 depicted in FIG. 6, the number of rows M is again equal to 32 and M1 is again equal to 4. The number of columns N is equal to the total number of code bits L divided by M. In this alternate embodiment, L=768, thus N=24 and N1=12. The interleaving matrix 600 is again filled starting from the top left corner and the first column is filled as described above with reference to FIG. 4. After the first column is filled, the thirty-third input bit (33) is filled into the first row of the 13th column. Once this column is completely filled (as was done for the first and 13th rows M is again equal to 32 and M1 is again equal to 4. The number of columns N is equal to the total number of code bits L divided by M. In this alternate embodiment, L=768, thus N=24 and N1=12. The interleaving matrix 600 is again filled starting from the top left corner and the first column is filled as described above with reference to FIG. 4. After the first column is filled, the thirty-third input bit (33) is filled into the first row of the 13th column. Once this column is completely filled (as was done for the first and 13th column), the sixty-fifth input bit (65) is filled into the first row of the 14th column. The process continues until all the code bits are filled into the interleaver matrix 600. For all data rates up to 64 kbps, M shall be equal to 48 and M1 shall be equal to 6. The number N is equal to the total number of code bits divided by M and N1=N/2. For code rate 144 kbps, M=24, M1=6, and N and N1 are determined in the same way as for other rates.

While the invention has been particularly shown and described with reference to a particular embodiment, it will be understood by those skilled in the art that various changes in form and details may be made therein without departing from the spirit and scope of the invention. The corresponding structures, materials, acts and equivalents of all means or step plus function elements in the claims below are intended to include any structure, material, or acts for performing the functions in combination with other claimed elements as specifically claimed.

What we claimed is:

1. A method of interleaving an input convolutionally coded signal in a spread spectrum communication system, the spread spectrum communication system implementing a coder providing codes having a predetermined constraint length, a predetermined number of consecutive trellis transition branches, the decoder further implementing a predetermined decoding depth, the method comprising the steps of:

determining a first maximum of the possible minimum-separation of a number of coded bits in the predetermined number of consecutive trellis transition branches;

determining a second maximum of the possible minimum-separation of a number of coded bits in the number of consecutive branches associated with the constraint length of the code;

determining a third maximum of the possible minimum-separation of a number of coded bits in the number of branches associated with the decoding depth; and interleaving the input convolutionally coded signal based on the first, second and third maximums so determined.

2. The method of claim 1, wherein the predetermined number of consecutive trellis transition branches is less than the constraint length of the code.

3. The method of claim 1, wherein the predetermined number of consecutive trellis transition branches equals the square root of the constraint length of the code.

4. The method of claim 1, wherein the spread spectrum communication system is compatible with IS-95A.

* * * * *